United States Patent [19]

Fürthaler et al.

[11] Patent Number: 5,094,983
[45] Date of Patent: Mar. 10, 1992

[54] METHOD FOR MANUFACTURE OF AN INTEGRATED MOS SEMICONDUCTOR ARRAY

[75] Inventors: Josef Fürthaler; Friedemann Gschwend, both of Heilbronn; Manfred Ohagen, Untergruppenbach; Peter Tomaszewski, Heilbronn, all of Fed. Rep. of Germany

[73] Assignee: TELEFUNKEN electronic GmbH, Heilbronn, Fed. Rep. of Germany

[21] Appl. No.: 594,736

[22] Filed: Oct. 9, 1990

[30] Foreign Application Priority Data

Oct. 11, 1989 [DE] Fed. Rep. of Germany ....... 3933908

[51] Int. Cl.$^5$ .............................................. H01L 21/31
[52] U.S. Cl. .................... 437/225; 437/48; 437/238; 437/241; 427/96
[58] Field of Search ............... 437/228, 225, 238, 239, 437/240, 241, 52, 48; 427/96

[56] References Cited

U.S. PATENT DOCUMENTS

| | | | |
|---|---|---|---|
| 4,163,072 | 7/1979 | Soos | 427/96 |
| 4,628,006 | 12/1986 | Rathbun et al. | 437/229 |

FOREIGN PATENT DOCUMENTS

| | | |
|---|---|---|
| 0072603 | 2/1983 | European Pat. Off. |
| 60-57635 | 4/1985 | Japan |
| 60-167432 | 8/1985 | Japan |
| 62-221121 | 9/1987 | Japan |
| 8400849 | 3/1984 | World Int. Prop. O. |

OTHER PUBLICATIONS

B. Gorowitz, et al., "Applications of Plasma Enhanced Chemical Vapor Deposition in VLSI", *Solid State Technology*, Jun. 1985, pp. 197-203.

IBM Technical Disclosure Bulletin, vol. 28, No. 9, Feb. 1986.

IBM Technical Disclosure Bulletin, vol. 26, No. 2, Jul. 1983.

T. Wada, et al., "The Influence of Passivation Layer on Aluminum Corrosion on Simulated Microelectronics Circuit Pattern", *Solid State Science and Technology*, Mar. 1989, pp. 732-735.

Dean Freeman et al., "Properties of Low-Pressure Chemical Vapor Deposited Dielectric Films from Hexamethyl-Disilazane", *J. Vac. Technol.* A7(3), May/Jun., pp. 1446-14507.

German Search Report, 5/15/90.

*Primary Examiner*—Brian E. Hearn
*Assistant Examiner*—T. N. Quach
*Attorney, Agent, or Firm*—Spencer & Frank

[57] ABSTRACT

A method of manufacture of an integrated MOS semiconductor array for the low-frequency range having MOS components and circuit paths arranged on a semiconductor substrate. Exposed surfaces between the circuit paths are made hydrophobic by germinating with hexamethyl disilazane (($CH_3)_3SiNHSi(CH_3)_3$), so that the occurrence of leakage currents is avoided. In addition, in an integrated MOS semiconductor array in which the MOS components and the circuit path are covered with a protective layer, the surface of this protective layer is made hydrophobic. As a result, both leakage currents and parasitic capacitances are prevented.

16 Claims, 1 Drawing Sheet

METHOD FOR MANUFACTURE OF AN INTEGRATED MOS SEMICONDUCTOR ARRAY

BACKGROUND OF THE INVENTION

The need for system integration led to the development of circuit techniques tailored to standard technologies—for example NMOS or CMOS technology—suitable for very large scale integration (VLSI). A technology-specific circuit method of this type is, for example, SC (switched capacitor) technology, with which PCM converters, discrete-time filters such as digital filters and programmable SC filters, A/D converters and continuous-time filters can be produced.

The circuits using SC technology are, in the case of capacitors and resistors, distributed elements, with parasitic capacitances and resistances being generated additionally.

For example, it was found that the gain in the case of an SC filter implemented with an n-tub CMOS process was subject to severe fluctuation during prober measurement of wafers, and that it was immaterial here whether the wafers were provided with a protective layer or uncovered. The causes for this were found to be surface leakage currents of 10 pA that can form as a result of the surface being altered by water absorption.

In addition, parasitic capacitances connected by the surface leakage currents are formed in the wafers provided with a protective layer.

A situation of this type is shown in FIGS. 1a and 1b, which each show a diagrammatic cross-sectional view of a MOS semiconductor array, where in each case two circuit paths 7a and 7b are mounted on a field oxide layer 2 generated in a semiconductor element 1 and comprise aluminum. The array in FIG. 1b is additionally covered by a protective layer 8, for example of silicon dioxide ($SiO_2$). Semiconductor wafers not provided with a protective layer in accordance with FIG. 1a are manufactured particularly in the development stage of a circuit. By contrast, in series production the semiconductor wafers in accordance with FIG. 1b are passivated with a protective layer, which serves first and foremost as protection against scratches.

After manufacture of the semiconductor wafers having MOS semiconductor arrays in accordance with FIGS. 1a and 1b, water collects on the hydrophilic oxide surface 9 between the circuit paths 7a and 7b or on the hydrophilic $SiO_2$ surface 10 of the protective layer 8, with the result that surface leakage currents form. The leakage current paths are shown in FIGS. 1a and 1b as dashed lines. In addition, the dielectric properties of the protective layer 8 lead to the formation of parasitic capacitances, identified in FIG. 1b as C1 and C2. These parasitic capacitances may have a disturbing effect particularly at low frequencies of, for example, 175 Hz, which leads in series production to high losses in the circuit yield because of non-reproducible measuring results during prober measurement. Prober measurement is however necessary, as otherwise defective chips are built up and manufacturing costs are too high.

SUMMARY OF THE INVENTION

The object of the invention is to provide a method for manufacture of an integrated MOS semiconductor array for the low-frequency range in which the aforementioned parasitic capacitances and surface leakage currents no longer occur.

According to the invention, in a MOS semiconductor array not covered by a protective layer, the exposed surface between the circuit paths is made hydrophobic, and in a MOS semiconductor array provided with a protective layer, the surface of this layer is made hydrophobic. In accordance with the invention, these surfaces become hydrophobic, i.e. water-repellent, and therefore conductive layers, causing the stated surface leakage currents and parasitic capacitances, do not occur. The result is a substantial increase in circuit gain, so that production costs for the semiconductor array are reduced considerably.

The lower production costs also stem from the fact that measurement (by prober) of the semiconductor arrays is not done after encapsulation, but can be performed beforehand, i.e., before division of the semiconductor wafer carrying the semiconductor arrays.

In a particularly advantageous embodiment of the method according to the invention, surfaces are made hydrophobic using hexamethyl disilazane ($(CH_3)_3SiNHSi(CH_3)_3$), hereafter referred to as HMDS.

Further advantageous embodiments of the invention are also described.

BRIEF DESCRIPTION OF THE DRAWINGS

The invention is described below in greater detail in conjunction with the drawings in which.

DESCRIPTION OF THE PREFERRED EMBODIMENTS

Figure 1A:
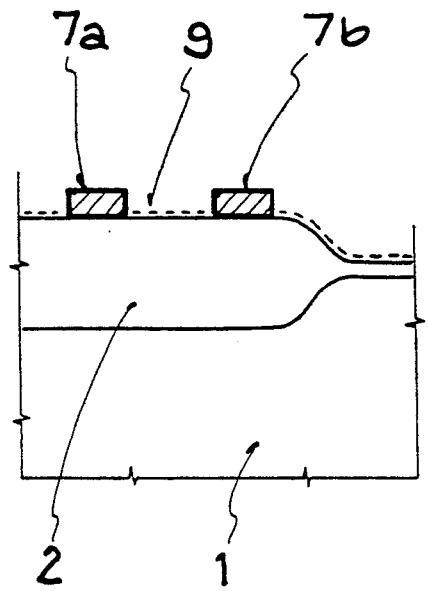
FIGS. 1a, 1b show a diagrammatic cross-sectional view of a MOS semiconductor array according the prior art.
Figure 1B:
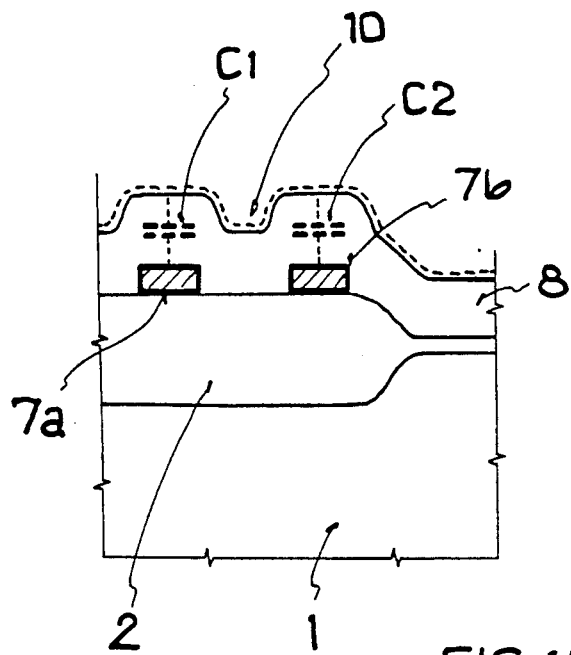
Figure 2:
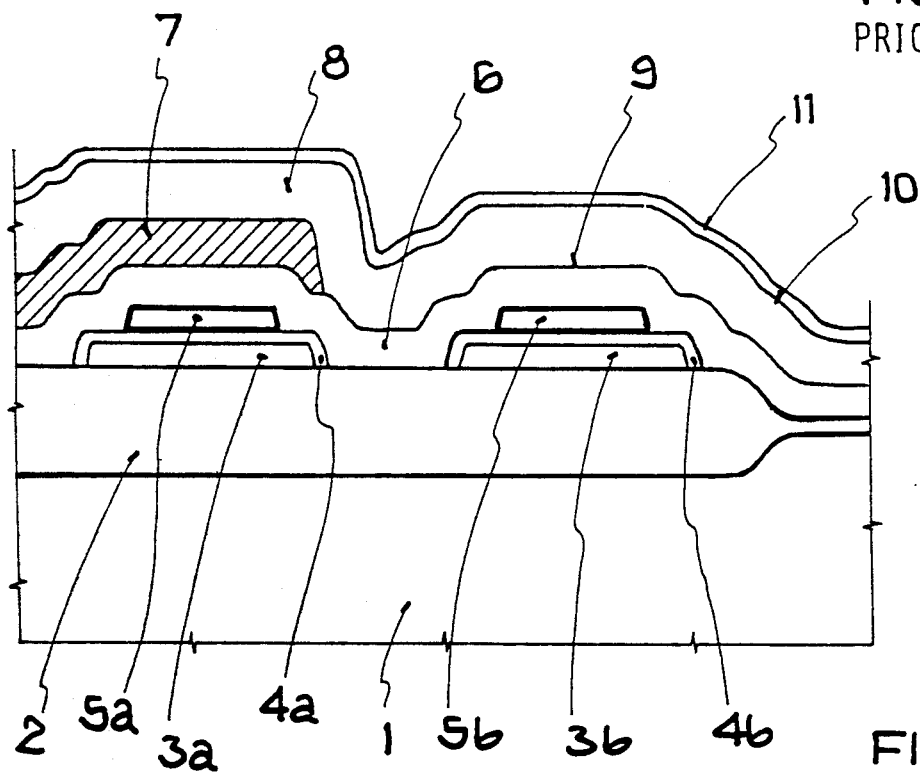
FIG. 2 shows a diagrammatic sectional view of a MOS semi-conductor array with 2 MOS capacitors produced using the method in accordance with the invention.

FIG. 2 shows a semiconductor element 1, a field oxide layer 2, a first polysilicon layer 3a, 3b a polysilicon oxide layer 4a, 4b, a second polysilicon layer 5a, 5b, an LTO (low temperature oxide) layer 6, a circuit path plane 7 and a protective layer 8. The first and second polysilicon layers 3a and 5a (or 3b and 5b) arranged on the field oxide layer 2 form together with the polysilicon oxide layer 4a and (or 4b, respectively) a MOS capacitor covered by the LTO layer 6. The circuit path plane 7 comprising aluminum and the LTO layer 6 are covered by a protective layer 8, for example of silicon dioxide ($SiO_2$) or silicon nitride ($Si_3N_4$), these layers being generated by a PECVD (plasma enhanced chemical vapour deposition) or LTO method. The surface 10 of this protective layer 8 is then germinated or seeded, i.e., treated, in an HMDS germinating facility with HMDS by introducing nitrogen ($N_2$) as a carrier gas finely distributed in HMDS, via a frit. The HMDS-charged carrier gas flows through a recipient in which germination proper of the semiconductor array passivated with the protective layer takes place takes place.

Here, the semiconductor arrays can be introduced into the recipients in various orientations in relation to the carrier gas current, for example in a horizontal or a vertical position with parallel flow of the carrier gas current or in a vertical position with frontal flow of the current. It was found that in the horizontal and vertical positions of the semiconductor arrays with parallel carrier gas current, the duration for a uniform HMDS germination of the stated surface is lower than with the vertical position with frontal flow.

The HMDS reacts with water when heat develops and a hydrophobic reaction product is created with separation of ammonia. The reaction product is given the reference number 11 in FIG. 2.

As a result of this treatment, the conductive moisture layer is removed from the surface, thereby preventing surface leakage currents and removing the parasitic capacitances.

The MOS semiconductor arrays arranged on the semiconductor wafers can now be reproducibly measured.

What is claimed is:

1. In a method of manufacture of an integrated MOS semiconductor array for the low-frequency range which includes forming MOS components and circuit paths on a semiconductor substrate, the method further comprising:
    making exposed surfaces between the circuit paths hydrophobic by germinating with hexamethyl disilazane $((CH_3)_3SiNHSi(CH_3)_3)$ to form a reaction product with water.

2. The method of claim 1, wherein germinating comprises:
    flowing an inert carrier gas with finely dispersed hexamethyl disilazane $((CH_3)_3SiNHSi(CH_3)_3)$ over the surfaces.

3. A method of manufacture of an integrated MOS semiconductor array for the low-frequency range which includes forming MOS components and circuit paths on a semiconductor substrate and covering said MOS components and said circuit paths with a protective layer, the method further comprising:
    making exposed surfaces of the protective layer hydrophobic by germinating with hexamethyl disilazane $((CH_3)_3SiNHSi(CH_3)_3)$ to form a reaction product with water.

4. A method according to claim 3, wherein the protective layer comprises silicon dioxide $(SiO_2)$ formed by CVD (chemical vapour deposition).

5. A method according to claim 3, wherein the protective layer comprises silicon dioxide $(SiO_2)$ formed by PECVD (plasma enhanced chemical vapour deposition).

6. A method according to claim 3, wherein the protective layer comprises silicon nitride $(Si_3N_4)$.

7. The method of claim 3, wherein germinating comprises:
    flowing an inert carrier gas with finely dispersed hexamethyl disilazane $((CH_3)_3SiNHSi(CH_3)_3)$ over the surfaces.

8. A method of manufacturing an integrated MOS device, comprising the steps of:
    forming MOS components and circuit paths on a substrate;
    making exposed surfaces of the MOS components and circuit paths hydrophobic by treating the surfaces with hexamethyl disilazane $((CH_3)_3SiNHSi(CH_3)_3)$ to react with water and produce a hydrophobic reaction product on the surfaces; and
    probing the device to test the MOS components.

9. The method of claim 8, wherein the reaction product is created with separation of ammonia.

10. The method of claim 8, wherein the exposed surfaces are an insulating layer having the circuit paths thereon.

11. The method of claim 8, wherein the exposed surfaces are on a protective layer over an insulating layer having the circuit paths thereon.

12. The method of claim 11, wherein the protective layer comprises silicon dioxide $(SiO_2)$ formed by CVD (chemical vapour deposition).

13. The method of claim 11, wherein the protective layer comprises silicon dioxide $(SiO_2)$ formed by PECVD (plasma enhanced chemical vapour deposition).

14. The method of claim 11, wherein the protective layer comprises silicon nitride $(Si_3N_4)$.

15. The method of claim 8, wherein the step of making exposed surfaces hydrophobic comprises flowing an inert carrier gas finely distributed in hexamethyl disilazane over the surfaces.

16. The method of claim 15, wherein the exposed surfaces are oriented in one of a horizontal and a vertical direction with respect to the carrier gas flow.

* * * * *